(12) United States Patent
Dehe et al.

(10) Patent No.: US 9,728,653 B2
(45) Date of Patent: Aug. 8, 2017

(54) MEMS DEVICE

(71) Applicant: Infineon Technologies AG, Neubiberg (DE)

(72) Inventors: Alfons Dehe, Reutlingen (DE); Mohsin Nawaz, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/947,823

(22) Filed: Jul. 22, 2013

(65) Prior Publication Data

US 2015/0021722 A1 Jan. 22, 2015

(51) Int. Cl.
*H04R 25/00* (2006.01)
*H01L 29/84* (2006.01)
*H01L 21/306* (2006.01)
*H04R 19/00* (2006.01)
*B81B 3/00* (2006.01)

(52) U.S. Cl.
CPC ............ *H01L 29/84* (2013.01); *B81B 3/0021* (2013.01); *H01L 21/30604* (2013.01); *H04R 19/005* (2013.01); *B81B 2201/0257* (2013.01); *B81B 2203/0136* (2013.01); *B81B 2203/053* (2013.01); *H04R 2201/003* (2013.01)

(58) Field of Classification Search
USPC ....................................................... 381/190
See application file for complete search history.

(56) References Cited

U.S. PATENT DOCUMENTS

| 6,847,154 | B2* | 1/2005 | Ito et al. .................... 310/313 D |
| 7,411,333 | B2 | 8/2008 | Kihara et al. |
| 7,545,945 | B2 | 6/2009 | Miles |
| 8,265,309 | B2 | 9/2012 | Zhang |
| 8,908,250 | B2 | 12/2014 | Nakatani |
| 9,402,137 | B2 | 7/2016 | Hsu et al. |
| 2005/0139577 | A1 | 6/2005 | Kim et al. |
| 2008/0123242 | A1* | 5/2008 | Zhou ...................... H01G 5/011 361/290 |
| 2010/0124343 | A1 | 5/2010 | Zhang |
| 2011/0075867 | A1* | 3/2011 | Chung ................... H04R 17/00 381/190 |
| 2011/0150260 | A1 | 6/2011 | Miles |

FOREIGN PATENT DOCUMENTS

| CN | 1901368 A | 1/2007 |
| CN | 101415137 A | 4/2009 |
| CN | 103124389 A | 5/2013 |
| JP | 2005519784 A | 7/2005 |
| JP | 2012220531 A | 11/2012 |

\* cited by examiner

*Primary Examiner* — Amir Etesam
(74) *Attorney, Agent, or Firm* — Slater Matsil, LLP

(57) ABSTRACT

A MEMS device includes a membrane comprising a first plurality of fingers. A counter electrode arrangement includes a second plurality of fingers disposed in a interdigitated relationship with the first plurality of fingers of the membrane. A deflector is configured to deflect the membrane such that the first and second plurality of fingers are displaced in a position excluding maximum overlapping of surfaces of the fingers.

29 Claims, 11 Drawing Sheets

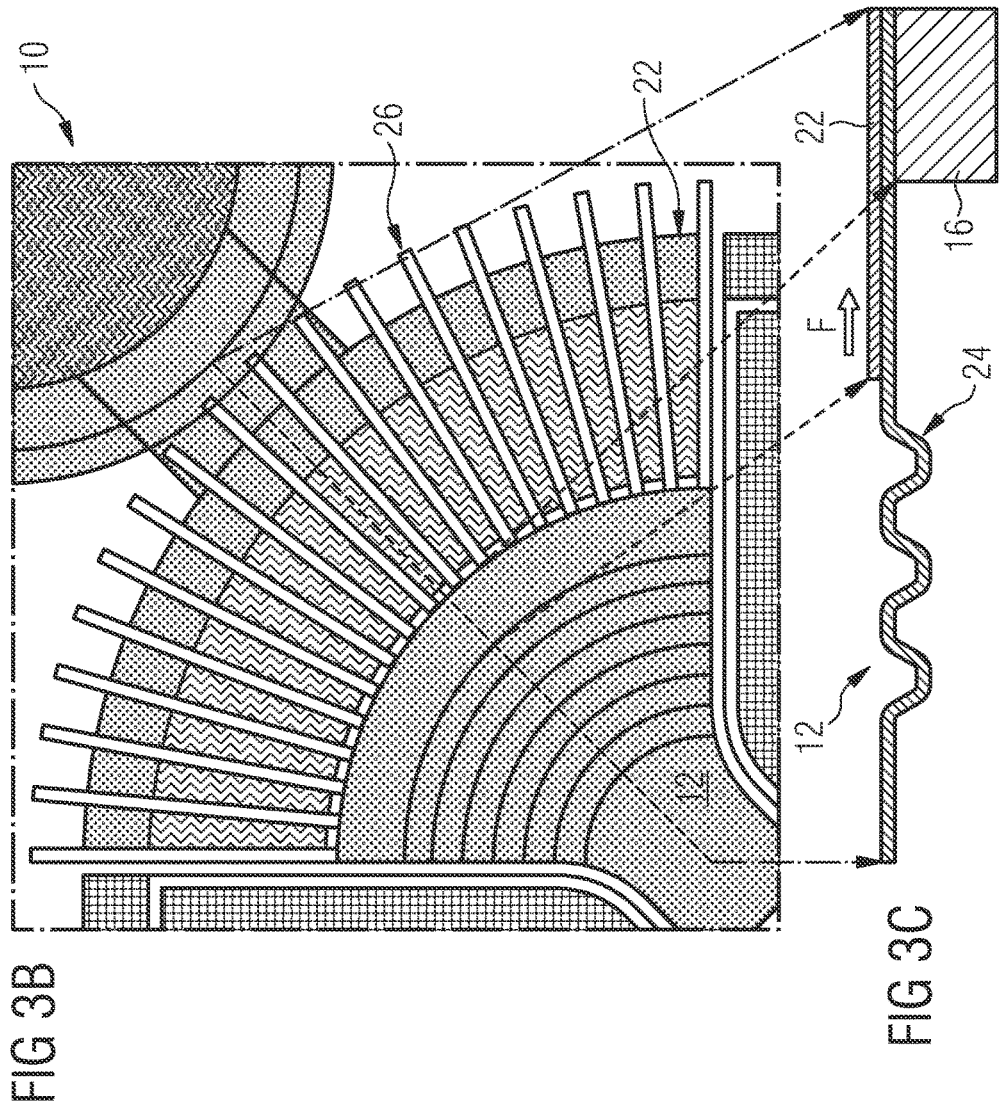
FIG 3B
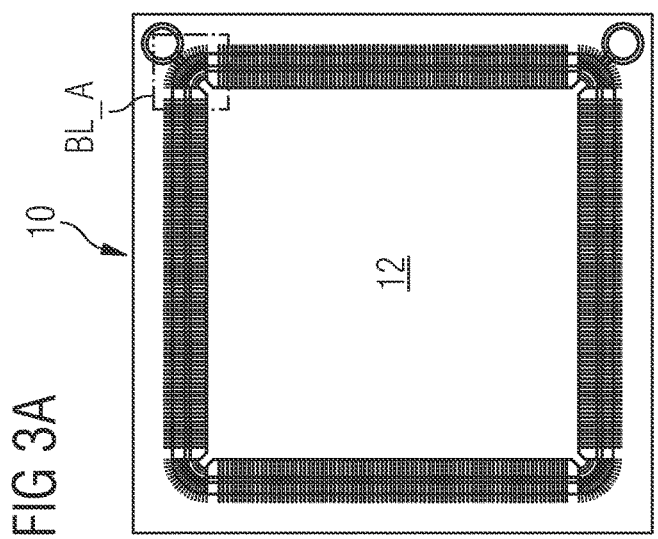
FIG 3A
FIG 3C

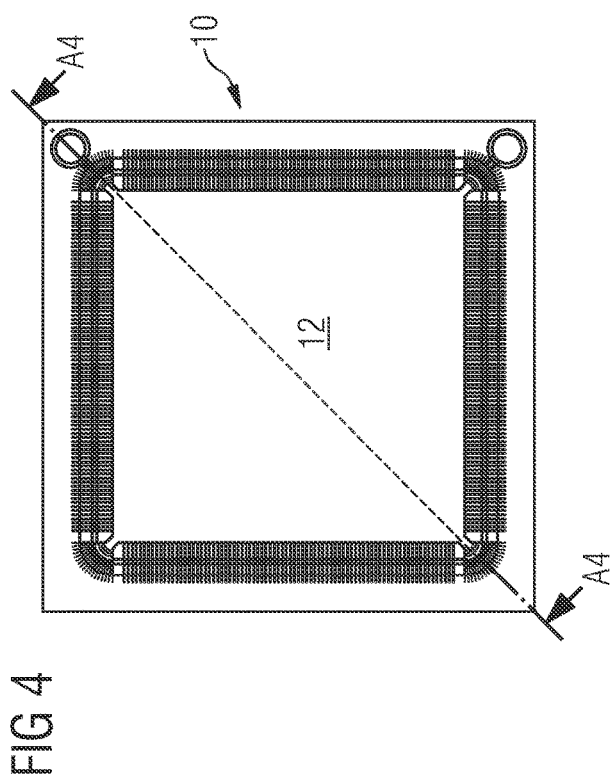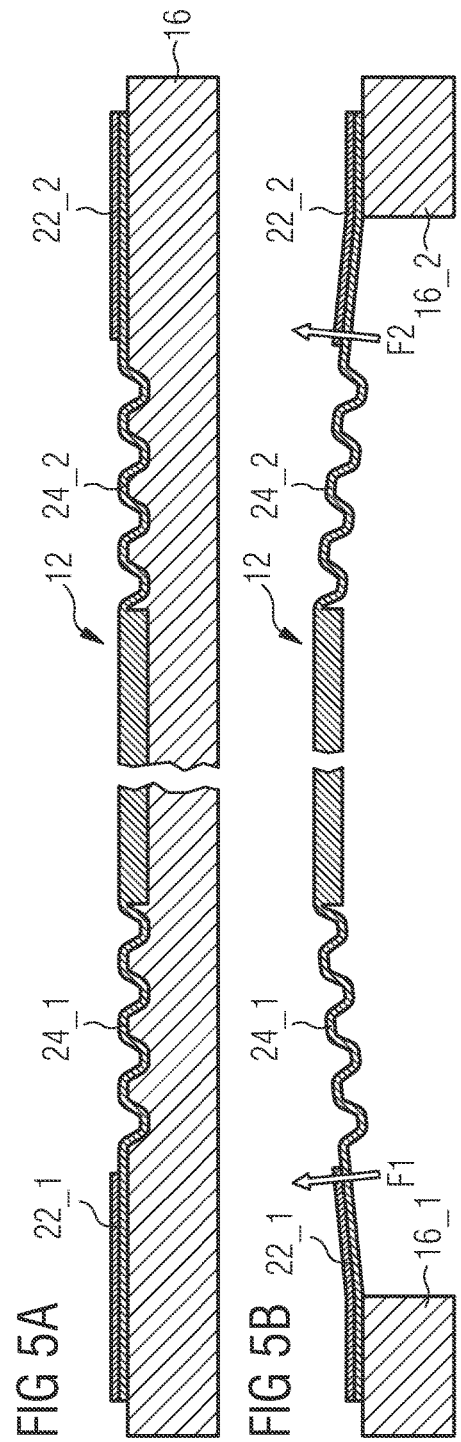

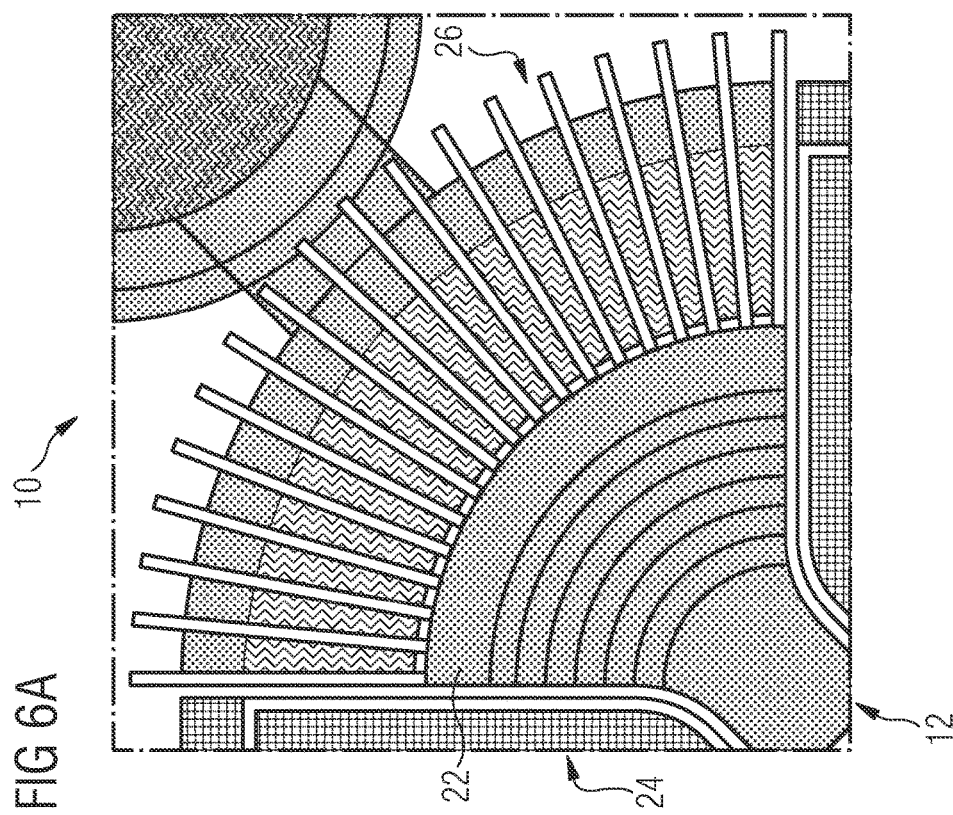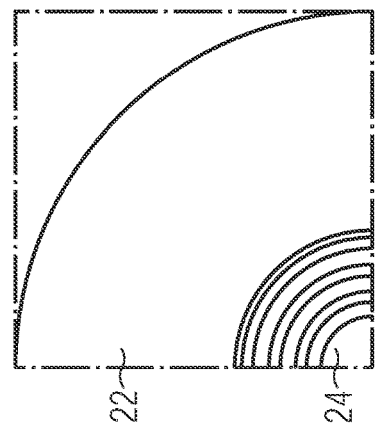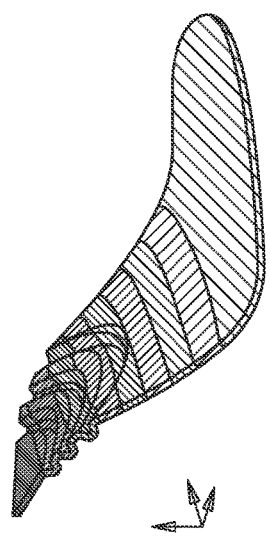

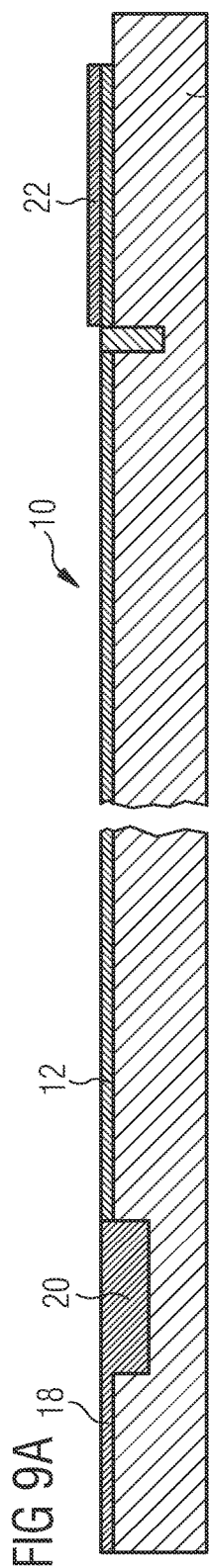
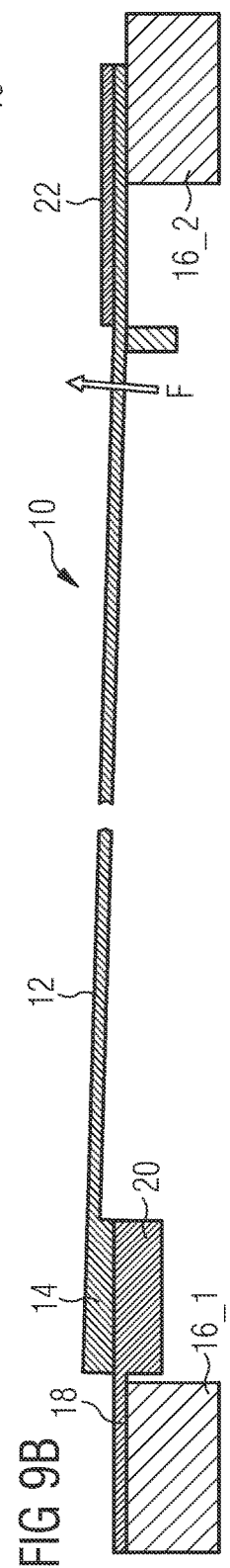
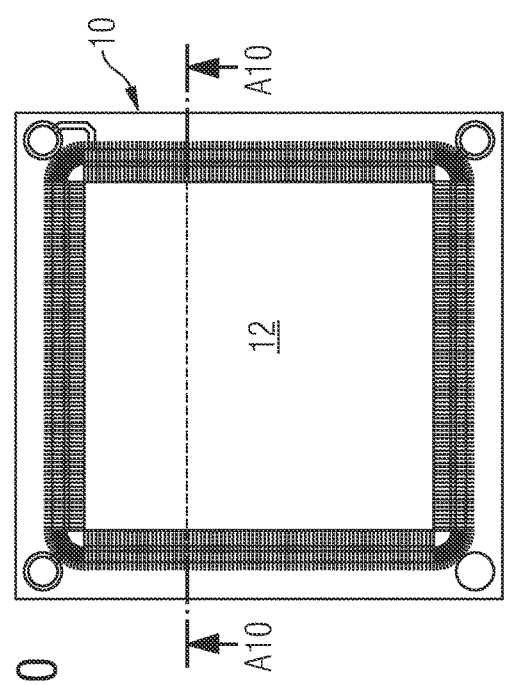

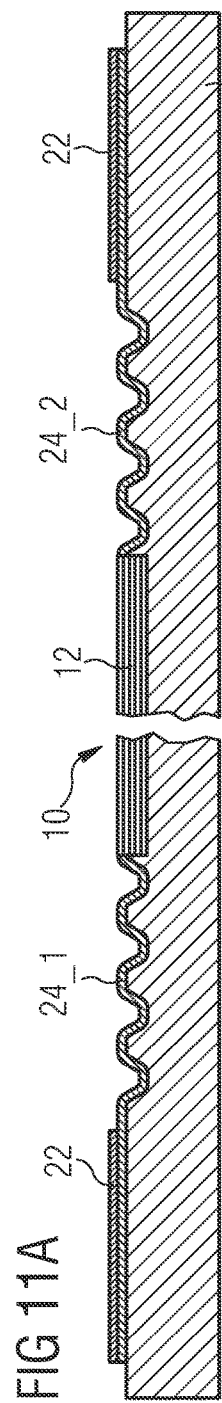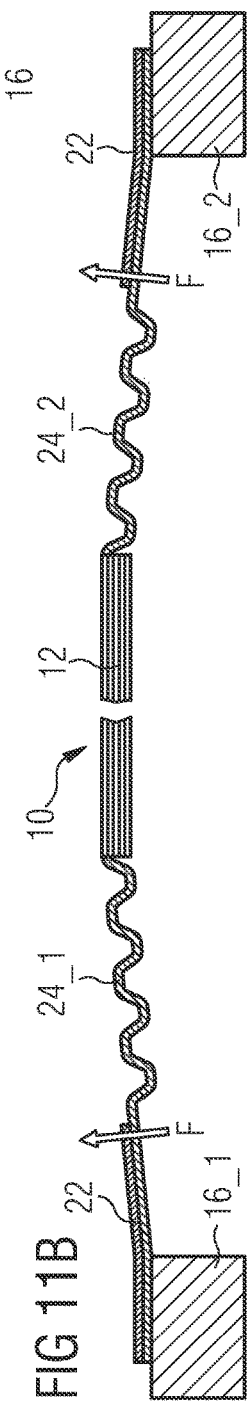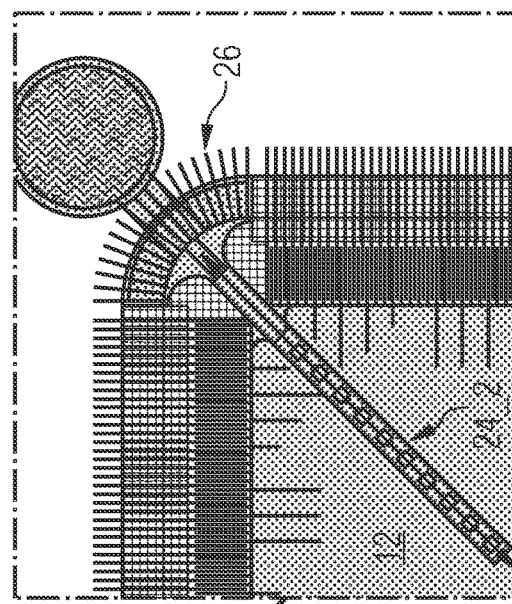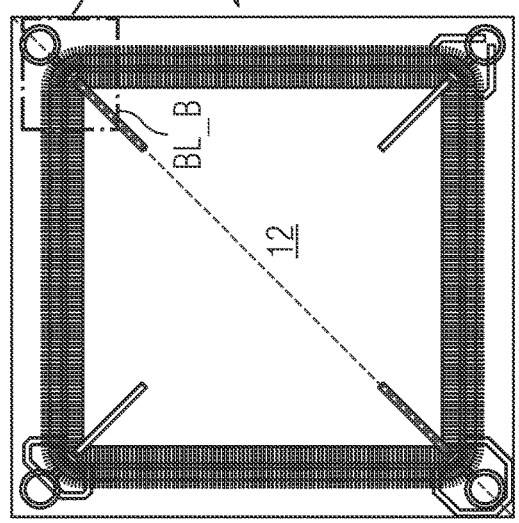

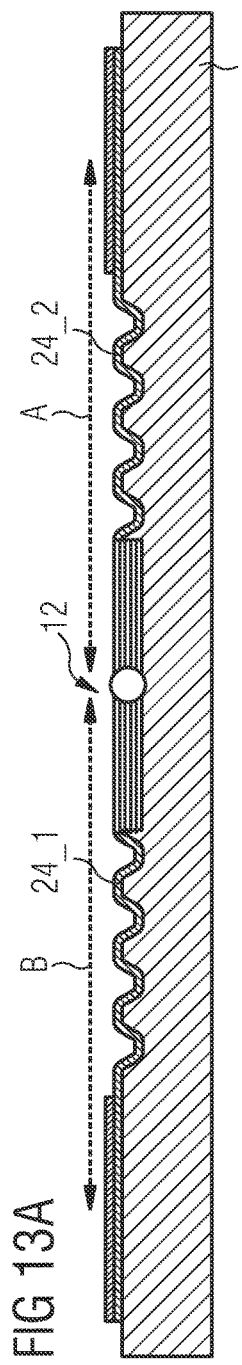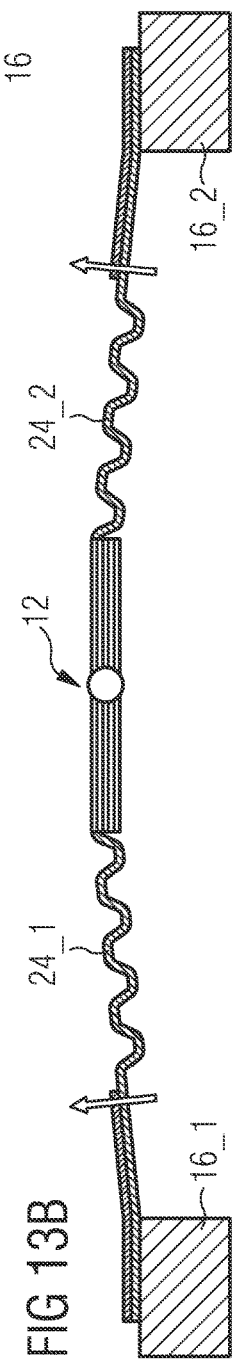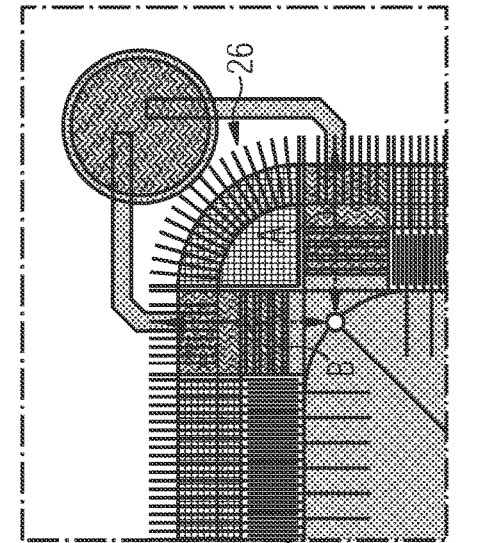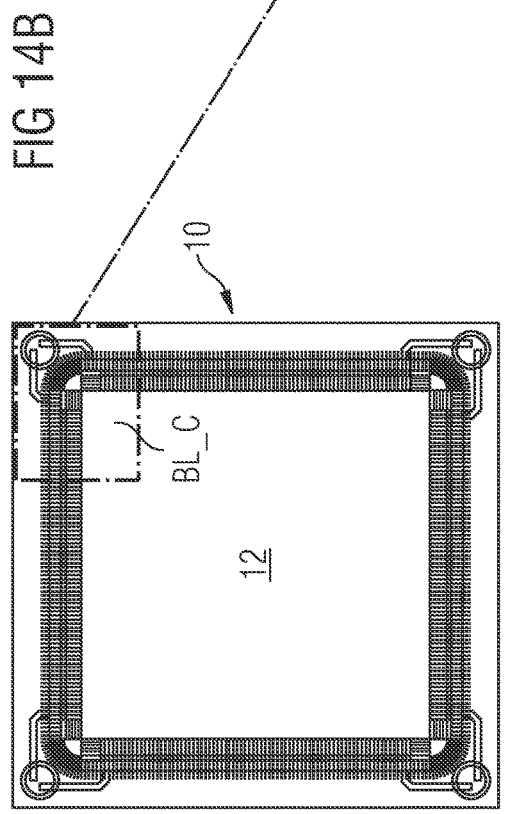

MEMS DEVICE

TECHNICAL FIELD

Embodiments of the invention refer to a MEMS device, to an electrostatic transducer and to a method for manufacturing a MEMS device.

BACKGROUND

Capacitor microphones may act to transduce the motion of a movable microphone membrane into an electric signal, wherein a fixed electrode, which is usually called a backplate, is typically placed in parallel and in close vicinity to the microphone membrane. Hence, the membrane may move relative to the backplate in response to input sound pressure. This movement may result in a sound pressure dependent variation of the capacitance of this microphone. This variation of the capacitance may be further translated to an electrical signal.

In order to enhance dynamic range of capacitance, comb sensor microphones are known comprising a microphone membrane that may comprise a plate. The plate may be resiliently supported by a fixed member. This structure can be fabricated in MEMS architecture. The membrane can be separated from the surrounding substrate by etching a slit around the perimeter while leaving the connection to the substrate intact, at least at one location of the perimeter.

Interdigitated fingers may be formed both at the membrane as well as the fixed substrate while typically being spaced apart from each other. Hence, a variable capacitance may be established between the moving membrane and the fixed substrate, this capacitance being variable in dependence to the movement of the membrane. Hence, a comb sensor microphone can be fabricated resulting in an in-plane comb sensor structure.

SUMMARY OF THE INVENTION

An embodiment of the invention provides a MEMS device comprising a membrane comprising a first plurality of fingers; a counter electrode arrangement comprising a second plurality of fingers disposed in an interdigitated relationship with the first plurality of fingers of the membrane; and a deflector configured to deflect the membrane such that the first and second plurality of fingers are displaced in a position excluding maximum overlapping of surfaces of the fingers.

A further embodiment provides a MEMS device comprising a membrane, a counter electrode arrangement, and a stress layer affixed to the membrane. The membrane comprises a first plurality of fingers. The counter electrode arrangement comprises a second plurality of fingers disposed in an interdigitated relationship with the first plurality of fingers. The stress layer comprises a material exhibiting different intrinsic stress compared to a material of the membrane.

A further embodiment provides an electrostatic transducer comprising a membrane that comprises a first plurality of fingers. The electrostatic transducer further comprises a counter electrode arrangement having a second plurality of fingers disposed in an interdigitated relationship with the first plurality of fingers of the membrane. The electrostatic transducer also comprises a deflector configured to deflect the membrane such that the first and second plurality of fingers are displaced in a position excluding maximum overlapping of surfaces of the fingers. The electrostatic transducer may be configured to produce an output signal responsive to a relative movement of the membrane and the counter electrode arrangement.

A further embodiment provides a method for manufacturing a MEMS device comprising a membrane and a counter electrode arrangement. The method comprises depositing a membrane layer on a surface. The method further comprises structuring the membrane layer to form an interdigitated comb drive comprising a first and second plurality of interdigitated fingers attached to the membrane and the counter electrode arrangement, respectively. The method also comprises providing a deflector affixed to a portion of the membrane layer, and performing a release etch which causes the deflector to deflect the membrane and to displace the first and second plurality of interdigitated fingers in a position excluding maximum overlapping of surface of the fingers.

BRIEF DESCRIPTION OF THE DRAWINGS

Embodiments of the present invention are described in the following with respect to the figures.

FIG. 3a shows an example of a comb sensor microphone layout in a plan view;

FIG. 3b shows a region of the comb sensor microphone layout surrounded by a block A in FIG. 3a in an enlarged plan view;

FIG. 3c shows a schematic cross-sectional view of the enlarged region depicted in FIG. 3b;

FIG. 4 shows another example of a comb sensor microphone layout in a plan view;

FIG. 5a shows a schematic cross-sectional view of the layout depicted in FIG. 4 before removing of a part of a support;

FIG. 5b shows a schematic cross-sectional view of the layout depicted in FIG. 4 after removing the part of the support;

FIG. 6a shows an enlarged region of a comb sensor microphone layout in a further example, the enlarged region depicting a corner region of the layout;

FIG. 6b schematically shows depositing of different materials in the enlarged region of the layout depicted in FIG. 6a;

FIG. 6c depicts a plot of a FEM simulation to the enlarged region of the layout depicted in FIGS. 6a and 6b;

FIG. 9a shows in a schematic cross-sectional view a part of a comb sensor microphone manufactured in-plane before removing parts of the support according to an example;

FIG. 9b shows the exemplary part depicted in FIG. 9a with parts of the support being removed;

FIG. 10 shows a layout of a comb sensor microphone in a plan view manufactured according to the exemplary schematic arrangement depicted in FIG. 9b;

FIG. 11a shows in a schematic cross-sectional view a part of a comb sensor microphone manufactured in-plane before removing parts of the support according to an example;

FIG. 11b shows the exemplary part depicted in FIG. 11a with parts of the support being removed;

FIG. 12a shows a layout of a comb sensor microphone in a plan view manufactured according to the exemplary schematic arrangement depicted in FIG. 11b;

FIG. 12b shows a region of the comb sensor microphone layout surrounded by a block B in FIG. 12a in an enlarged plan view;

FIG. 13a shows in a schematic cross-sectional view a part of a comb sensor microphone manufactured in-plane before removing parts of the support according to an example;

FIG. 13b shows the exemplary part depicted in FIG. 13a with parts of the support being removed;

FIG. 14a shows a layout of a comb sensor microphone in a plan view manufactured according to the exemplary schematic arrangement depicted in FIG. 13b;

FIG. 14b shows a region of the comb sensor microphone layout surrounded by a block C in FIG. 14a in an enlarged plan view;

DETAILED DESCRIPTION OF ILLUSTRATIVE EMBODIMENTS

Figure 1:
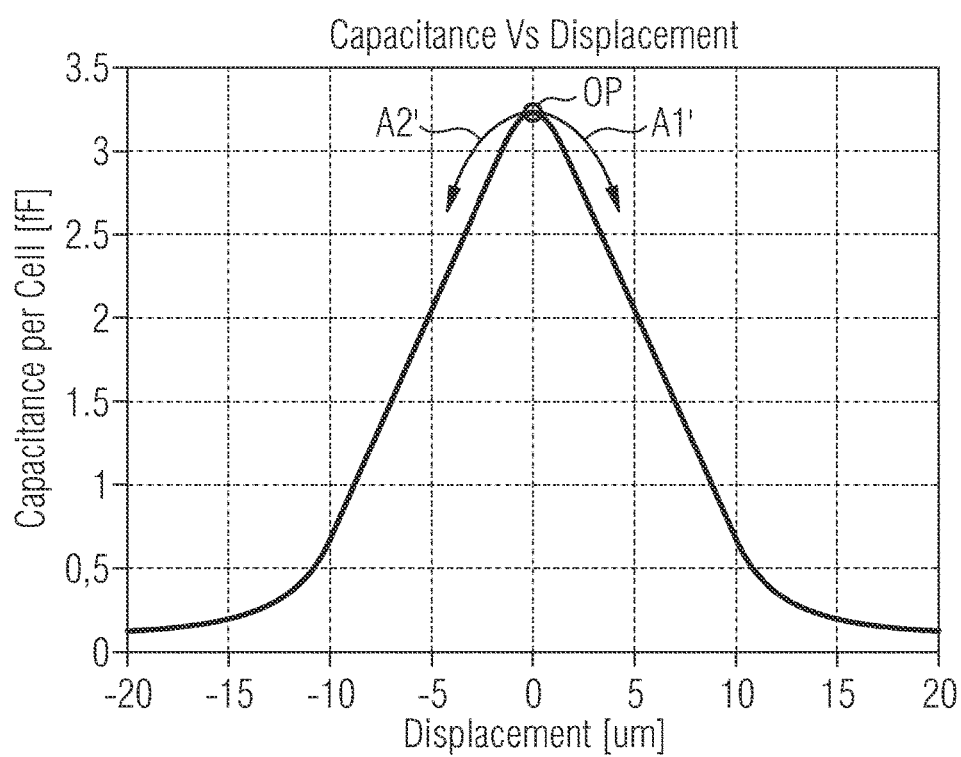
FIG. 1 shows a chart diagram depicting capacitance per cell of a comb sensor microphone versus displacement of fingers of a membrane in relation to fingers of a counter electrode arrangement in case of about 100% overlapping of respective fingers in a rest position.

Different embodiments of the teachings disclosed herein will subsequently be discussed referring to FIGS. 1-17c. In the drawings, identical reference numerals are provided to objects having identical or similar functions so that objects referred to by identical reference numerals within the different embodiments are interchangeable and the description is mutually applicable.

Referring to FIG. 1, a chart diagram is shown depicting a capacitance of a MEMS device, for example a comb sensor microphone, versus displacement of fingers of a membrane in relation to fingers of a counter electrode arrangement in case of about 100% overlapping of respective fingers in a rest position.

In the chart diagram, capacitance values are plotted on the axis of ordinate, beginning from 0 fF to 3.5 fF. Values of displacement of respective fingers in relation to each other are plotted on the axis of abscissae, beginning from −20 μm to +20 μm. Hence, displacement of 0 μm is defined to the center of the axis of abscissae. In the case shown in the chart diagram of FIG. 1, in the rest position of the MEMS device, the respective fingers are overlapped to each other by 100%. In other words, maximum overlapping is established in case of the MEMS device is in rest position.

Hence, an operating point OP of the MEMS device is positioned centered at 0 μm. Note that the operating point OP represents displacement of respective fingers in rest position and gives information about resulting capacitance value.

Assuming the MEMS device is a comb sensor microphone, rest position is established in case of 0 dB loudness in the ambience around this microphone. As can be seen in the chart diagram of FIG. 1, in case the comb sensor microphone is kept in rest position, i.e., 100% overlapping of the respective fingers, a maximum capacitance of 3.25 fF is established in a unit cell defined by respective fingers.

The reason for this is that according to the formula defining capacitance of a plate condenser:

$$c = \varepsilon_0 \varepsilon_r * \frac{A}{g}$$

the capacitance c assumes maximum value in case of the area A assumes maximum value (in case of the remainder, i.e., relative dielectric constant $\varepsilon_r$ and gap width g, is kept constant). In other words, the larger the overlapping area A is, the larger is the capacitance. Note that the above indicated formula for the capacitance c is only a relatively coarse approximation for cases in which the first plurality of fingers is displaced with respect to the second plurality of fingers.

As can be seen in the chart diagram of FIG. 1, displacement of respective fingers in relation to each other, i.e., both negative displacement as well as positive displacement, may result in decreasing capacitance. In case of the respective fingers are displaced by −20 μm, the capacitance tends to zero. Further, as can be seen in the chart diagram of FIG. 1, in a range of displacement comprising +/−2.5 μm to +/−10 μm, the curve runs nearby linear.

Figure 2:
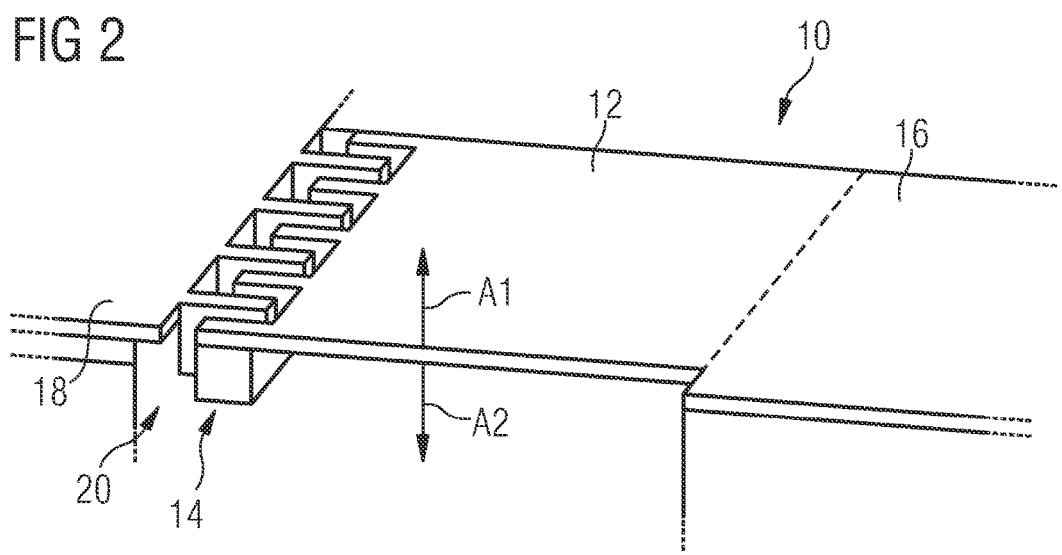
FIG. 2 shows a schematic diagram of the comb sensor microphone arrangement in case of about 100% overlapping of the respective fingers in the rest position.

FIG. 2 shows a schematic diagram of a MEMS device 10, for example a comb sensor microphone. The MEMS device 10 may comprise a movable membrane 12 comprising a first plurality of fingers 14 attached to the membrane 12 and projecting outward from a portion of a perimeter of the membrane 12. The MEMS device 10 may further comprise a support 16, wherein the membrane 12 may be attached to the support 16 resiliently via a resilient attachment. Further comprised is a counter electrode arrangement 18 having a second plurality of fingers 20 disposed in a spaced apart, interdigitated relationship with the first plurality of fingers 14 of the membrane 12. The fingers in the first plurality and/or the second plurality of fingers may be fixed fingers. In FIG. 2, the membrane 12 is shown in a rest position in which approximately maximum overlapping of surfaces of the fingers of the first plurality of fingers 14 and second plurality of fingers 20 is established. The surfaces of the fingers may be substantially orthogonal to a planar extension of the membrane 12.

Having regard to the arrangement of the MEMS device 10 shown in FIG. 2 and referring back to the chart diagram shown in FIG. 1, in the rest position (i.e., displacement equals 0 μm) the MEMS device 10 exhibits maximum capacitance (i.e., 3.25 fF) per unit cell.

Displacement of the membrane 12 in a direction indicated by an arrow A1 in FIG. 2 (upward direction) may result in a decrease of the capacitance per unit cell as indicated by an arrow denoted by A1' in the chart diagram of FIG. 1. Displacement of the membrane 12 in a direction indicated by an arrow denoted with A2 in FIG. 2 (downward direction) may also result in a decrease of capacitance per unit cell as indicated by an arrow denoted by A2' in the chart diagram of FIG. 1. As can be seen in the chart of FIG. 1, this up and down movement of the membrane 12 results in that the capacitance per unit cell continuously runs in a capacitance range showing non-linear characteristics. In other words, in case of 100% overlapping of respective fingers in the rest position, the MEMS device 10 might produce a non-linear signal with frequency doubling. This may not be optimal for a MEMS device functionality, for example a comb sensor microphone, that may rather need a large dynamic range of linear operation.

FIG. 3a shows a MEMS device 10, for example a comb sensor microphone, in a plan view. FIG. 3b shows an enlarged region of the MEMS device 10. FIG. 3c shows a schematic cross-sectional view of the enlarged region of the MEMS device layout, according to an example. The membrane 12 may be shaped substantially rectangular comprising four length sides. The first plurality of (fixed) fingers 14 of the membrane 12 may be arranged along portions of each of the length sides of the membrane 12, the fingers 14 extending outside. The counter electrode arrangement 18 may comprise the second plurality of (fixed) fingers 20 disposed in an interdigitated relationship with the first plurality of fingers 14 of the membrane 12. In this example, supports 16 may be disposed at four corners of the layout arrangement. Hence, the membrane 12 may be attached to the support 16, while being resiliently moveable up and down (in and out of the drawing plane).

FIG. 3b shows an enlarged region of the MEMS device 10 representing a region of the layout surrounded by a block BL_A in FIG. 3a. In particular, FIG. 3b shows an enlarged view showing one of the four supports 16 of the MEMS device 10. As mentioned above, the membrane 12 may be attached to the support resiliently by a resilient attachment. Further, the MEMS device 10 may comprise a deflector, such as a stress layer 22, which is configured to, in rest position of the MEMS device 10, deflect the membrane 12 such that the first 14 and second 20 plurality of fingers (refer to FIG. 2) may be displaced in a position excluding maximum overlapping of surfaces of the fingers, respectively. The deflection of the membrane caused by the deflector is typically at least in a direction normal (i.e., orthogonal) to a plane of the membrane. In other words, the deflection may comprise an orthogonal component. The deflection of the membrane caused by the deflector may also be regarded as non-parallel with respect to the plane of the membrane. A deflection or displacement of the membrane in response to an action of the deflector along an oblique direction with respect to the plane of the membrane is also conceivable. The deflection of the membrane may define a new rest position which is within one of the substantially linear sections of the capacity over displacement characteristic. For example, in the MEMS device 10 shown in FIG. 3a, in the new rest position, the membrane 12 may be lifted up by the deflector in a direction out of the drawing plane. Otherwise, the membrane 12 can be depressed by the deflector such to be deflected in a direction into the drawing plane. The MEMS device 10 may further comprise a fixation 26 for radially affixing the resilient attachment of the membrane 12 to the support.

Compared to the case described above referring to FIGS. 1 and 2, this displacement of the first 14 and second 20 plurality of fingers in the rest position of the MEMS device 10, may result in that the fingers exhibit a capacitance per unit cell excluding maximum capacitance. Contrary to the case described above referring to FIGS. 1 and 2, in rest position of the MEMS device, capacitance can be in a range showing linear characteristics. Based on the (displaced) rest position of the membrane 12 defined above, moving the membrane 12 up and down, as mentioned above having regard to FIGS. 3a and 3b, may result in the effect that capacitance is changed substantially linear in response to this movement.

FIG. 3c shows a schematic cross-sectional view of the enlarged region of the MEMS device layout depicted in FIG. 3b in plan view. The stress layer 22 may be disposed onto a part of the membrane 12 comprising resilient attachment 24 of the membrane 12. Further the stress layer 22 may be disposed to overlap at least a section of the support 16. The stress layer 22 may be directly or indirectly affixed to the membrane 12.

The stress layer 22 may be composed of a material exhibiting different intrinsic stress compared to the material of the membrane 12. The material of the stress layer 22 can be selected from dielectric material. In semiconductor technology, exemplary dielectric materials comprise oxide, SiN, $Si_3N_4$, $Si_xN_yO$, Poly-Imid, etc. Furthermore, the stress layer 22 can be selected from a semiconductive or conductive material such as Poly-Si, aluminum or copper.

The material of the membrane 12 may be selected from conductive or semi-conductive material for connecting the membrane 12 to a sensor electrode of the MEMS device. In semiconductor technology, exemplary conductive materials may comprise mono-silicon (bulk or SOI), poly-silicon or metals like aluminum, AlSiCu, etc.

The stress layer 22 and the membrane 12 may be selected from materials, respectively, creating, when bonded to each other, a force F in relation to each other resulting in a contraction or expansion of the stress layer 22 in relation to the membrane 12. This phenomenon may be called bimorphic layer stress. The stress layer 22 may be an underlying layer or an overlying layer with respect to the membrane 12. In the alternative, both an underlying stress layer and an overlying stress layer may be provided, in which case the overlying stress layer may be subject to a contraction and the underlying stress layer may be subject to an expansion in relation to the membrane 12, or vice versa.

An advantageous combination of materials comprising different stress level when bonded to each other may comprise poly-silicon and silicon nitride, for example. Note that poly-silicon can exhibit a force of contraction or expansion of 100 MPa with respect to monocrystalline silicon, whereas silicon nitride can exhibit a force of contraction of 1,000 MPa with respect to monocrystalline silicon in case of these materials are bonded to each other. Hence, the high intrinsic stress of silicon nitride SiN may cause the resilient attachment 24 of the membrane 12 to bend. In case of these materials (poly-silicon and silicon nitride) are bonded to each other, the resilient attachment 24 may bends in a direction to the stress layer 22. In other words, the membrane 12 may be deflected upwards in the schematic representation of FIG. 3c.

Another advantageous combination of materials comprising different stress level when bonded to each other may comprise poly-silicon and imide. In case these materials are bonded to each other, the resilient attachment 24 may bend in a direction towards the stress layer 22. Hence, the membrane 12 may be deflected upwards, too.

Another advantageous combination of materials comprising different stress level when bonded to each other may comprise poly-silicon and oxide. In case these materials are bonded to each other, the resilient attachment 24 may bend in a direction towards the poly-silicon. In this case, the membrane 12 may be deflected downwards in the schematic representation of FIG. 3c.

Note that pre-deflection of the membrane 12 either upwards or downwards is a design choice depending on the respective application of the MEMS device 10.

The stress layer 22 and the membrane 12 may be arranged such that the contraction or expansion of the stress layer 22 may result in deflection of the membrane 12. In the example shown in FIG. 3a, in a plane parallel to the surface of the membrane 12, i.e., parallel to the drawing plane, the stress layer 22 may be configured to offset planes of the first 14 and second 20 plurality of fingers against each other, by causing a displacement or deflection of the membrane 12.

Referring back to FIG. 3c, the resilient attachment 24 is shown to comprise a portion of the membrane 12 having a corrugated configuration. This corrugated configuration may assist in deflecting or displacing the membrane 12 in an upward or downward direction. While in FIG. 3c the resilient attachment 24 is shown to comprise a portion of the membrane 12 having a corrugated configuration, other configurations are conceivable assisting in deflecting the membrane 12 in an upward or downward direction. As can be seen in FIG. 3b, the corrugations of the resilient attachment 24 may have a quarter-circle shape. Other shapes are conceivable allowing contraction or expansion of the resilient attachment 24.

FIG. 4 shows a MEMS device 10 layout in a plan view. FIGS. 5a and 5b show a schematic cross-sectional view cut along the line A4-A4 in FIG. 4. FIGS. 5a and 5b show a solution enabling displacement of the membrane 12 to a new rest position. In this solution, displacement of the membrane 12 may be achieved by the bimorphic layer stress and the corrugated form of at least a part the membrane 12, i.e., resilient attachments 24_1, 24_2.

As can be seen in FIG. 5a, the membrane 12 may be formed by depositing material on the surface of a preformed support 16. The membrane 12 can be made of a material comprising poly-silicon. Then, stress layers 22_1, 22_2 may be bonded to the surface of the membrane 12. In particular, the stress layers 22_1, 22_2 may be deposited on both end sides of the membrane 12. The stress layers 22_1, 22_2 can be made of a material comprising silicon nitride. FIG. 5b shows the assembly described above, wherein parts of the support 16 may be removed such that supports 16_1, 16_2 may remain at end sides of the membrane 12. Note that the support 16 (refer to FIG. 5a) may serve as a sacrificial layer being etched so that the supports 16_1, 16_2 may remain at end sides of the membrane 12. By removing parts of the support 16, the membrane 12 may be released to move upwards.

After etching parts of the support 16, the membrane 12 may be deflected in an upward direction. The reason for this is that the stress layers 22_1, 22_2 may be composed of a material, e.g., silicon nitride, exhibiting intrinsic stress compared to the material, e.g., poly-silicon, of the membrane 12, wherein the stress layers 22_1, 22_2 may be deposited on positions overlapping at least parts of the remaining supports 16_1, 16_2. Furthermore, the corrugated form of the resilient attachments 24_1, 24_2, respectively, may allow an expansion of the membrane 12 such that the membrane 12 can be deflected upwards relatively easily. The different intrinsic stresses exhibited by bonding the material of the stress layers 22_1, 22_2 to the material of the membrane 12 may result in a contraction of the stress layers 22_1, 22_2 in relation to the membrane 12, which contraction may result in bending moments at end sides of the membrane 12. These bending moments in turn may result in forces directed substantially upwards, as schematically indicated by arrows F1, F2 in FIG. 5b.

FIG. 6a shows a plan view of the MEMS device 10 depicting a part of the membrane 12 comprising the resilient attachment 24 in enlargement. The resilient attachment 24 may be corrugated to allow deflecting of the membrane 12. Further comprised may be a stress layer 22 which may be bonded to a surface of the membrane 12. As mentioned above, the stress layer 22 and the membrane 12 may be selected from materials, respectively, creating, when bonded to each other, a force in relation to each other resulting in a contraction of the stress layer 22. This contraction results in a bending moment, resulting in a force which, in association with the corrugated form of the resilient attachment 24, may resiliently displace the membrane 12 upwards (e.g., in a direction out of the drawing plane).

FIG. 6b is a schematic view corresponding to the view shown in FIG. 6a, wherein FIG. 6b depicts materials selected for the resilient attachment 24 of the membrane and the stress layer 22. In this example, the membrane may be composed of poly-silicon, whereas the stress layer may be composed of silicon nitride SiN.

FIG. 6c depicts a plot of a simulation based on finite element method (FEM). In this plot the displacement of the membrane is emphasized in the vicinity of the resilient attachment. This simulation is based on a variant comprising an anchor length of about 100 μm, a silicon nitride coverage of 46 μm and a number of corrugations N=3. Based on these parameters, the membrane experiences an offset of 4.5 μm.

Figure 7:
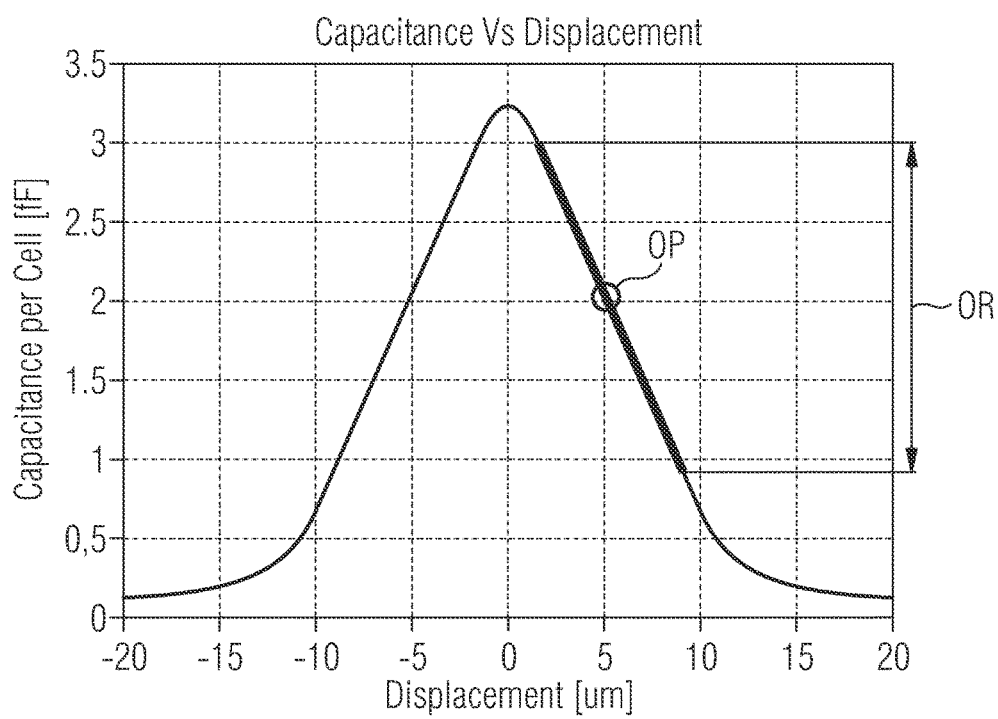
FIG. 7 shows a chart diagram depicting capacitance per cell of a comb sensor microphone versus displacement of fingers of a membrane in relation to fingers of a counter electrode arrangement in case of, in a rest position of the membrane, respective fingers being displaced in a position excluding 100% overlapping.

FIG. 7 depicts a chart diagram plotting a curve representing capacitance of a unit cell of a MEMS device versus displacement of respective fingers of the MEMS device which may be moveable to each other. This chart diagram corresponds to the chart diagram depicted in FIG. 1.

However, in contrast to the chart diagram shown in FIG. 1, the operating point OP of the MEMS device is positioned substantially centered in an operating range OR showing a linear characteristic. Note that the operating point OP may represent a displacement of respective fingers in rest position and may give information about resulting capacitance value.

Referring to the chart diagram shown in FIG. 7, it is assumed that the MEMS device may be configured as a comb sensor microphone (refer to FIG. 2). It is further assumed that the plurality of fingers attached to the moveable membrane and the plurality of fingers attached to the counter electrode arrangement may be displaced against each other by about 5 μm in the rest position. The capacitance per unit cell is about 2 fF.

Under this assumption, movement of the membrane caused by pressure variations induced by loudness, for example, may result in the operating point shifting in a range between 2 μm to 9 μm. Hence, the capacitance value may vary in a range between about 3 fF and about 0.9 fF. Within this operation range, it may be assumed that maximum sound pressure may equal about 200 Pa (equivalent to sound pressure level=140 dBSPL) at membrane compliance Cm=22 nm/Pa.

In comparison to the chart diagram shown in FIG. 1, the operating point depicted in the chart diagram shown in FIG. 7 may be centered with respect to a relatively large dynamic range of linear operation.

Figure 8A:
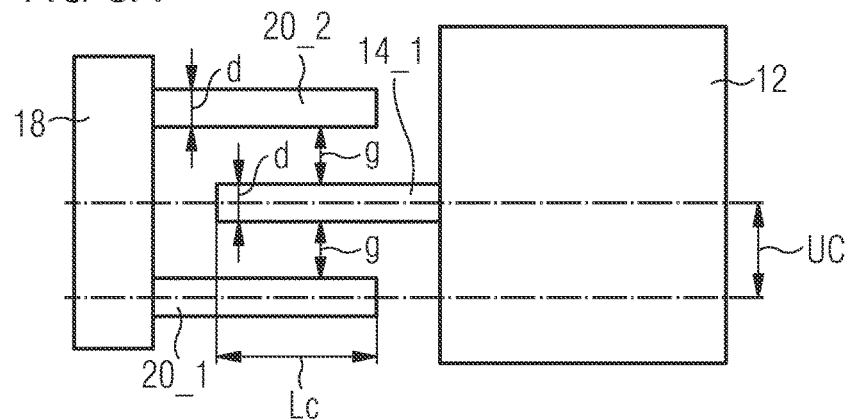
FIG. 8a schematically depicts a single finger of the membrane sandwiched between two fingers of the counter electrode arrangement in a plan view.

Note that the capacitance values given in the chart diagrams of FIGS. 1 and 7 stand for a single plate capacitor, referred to as unit cell UC, established between two surfaces of two fingers being movable to each other. FIG. 8a shows this arrangement in more detail. In particular, FIG. 8a shows a plan view of a section of interdigitated first and second fingers. In this arrangement, one first finger 14_1 of the first plurality of fixed fingers attached to the membrane 12 is sandwiched in a spaced apart, interdigitated relationship between two second fingers 20_1, 20_2 of the second plurality of fixed fingers attached to the counter electrode arrangement 18 (refer to FIG. 2). The distances g between the respective fingers are all about equal. Further, the first finger 14_1 may extend across a line running parallel and centered to the elongations of the second fingers 20_1 and 20_2. Further, thicknesses d of each of the first and second fingers 14_1, 20_1 and 20_2 may be all about the same. In this arrangement, the first finger 14_1 may be moveable in relation to the second fingers 20_1, 20_2 in a direction perpendicular to the drawing plane.

Figure 8B:
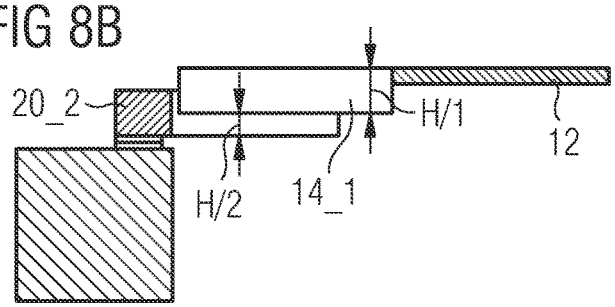
FIG. 8b shows the schematic arrangement depicted in FIG. 8a in a cross-sectional view.

FIG. 8b shows the arrangement depicted in FIG. 8a in a cross-sectional view. This figure shows the membrane 12 in a rest position deflected in an upward direction such that the first finger 14_1 attached to the membrane 12 is displaced in a position excluding maximum overlapping of surfaces of the fingers 14_1 and 20_2. Based on this displacement, the operating point OP of capacitance per unit cell is centered to a dynamic range showing substantially linear characteristic (refer to FIG. 7).

For example, the amount of displacement can be about half of the height H of the fingers 14_1, 20_2 (half overlap), assuming that the heights H of the fingers are all the same. In this example, the deflector may be configured to set an overlapping area of the first and second plurality of fingers within 50% overlapping. Preferably, the overlapping area/height of the first and second plurality of fingers may be selected to be offset in a range of 40% to 60% of the area/height of one finger.

FIGS. 9a and 9b show an example for manufacturing a MEMS device 10 in a schematic cross section view cut along a line A10-A10 of FIG. 10. The left portion of the cross section views in FIGS. 9a and 9b show the comb sensor microphone comprising the interdigitated fingers 14 and 20. The right portion of the cross section views show the resilient attachments with the stress layer 22. The surface of a support 16, for example, a sacrificial layer, may be performed such that the material forming the membrane 12 can be deposited on this surface in-plane. The material of the membrane 12 can be selected from poly-silicon. Further, the material forming the counter electrode arrangement 18 can be deposited on the surface of the support 16. Both the membrane 12 as well as the counter electrode arrangement 18 are formed to comprise respective fingers 14, 20 attached integrally, respectively. Additionally, the stress layer 22 may be deposited on the surface of the membrane 12 at a position opposing the respective fingers 14, 20.

FIG. 9b shows the arrangement shown in FIG. 9a after removing parts of the support 16 excluding part (support 16_1) used to support the counter electrode arrangement 18 and a part (support 16_2) used to support the membrane 12 at a location opposed to respective fingers 14, 20. After removing parts of the support 16 by etching, the membrane 12 may be released to deflect upwards. The bimorphic nature of the silicon nitride layer of the stress layer 22 and the poly-silicon layer of the membrane 12 may cause the layers 12, 22 to contract from the poly-silicon layer towards the silicon nitride layer. This contraction may result in a force indicated by an arrow F, which force F may cause the membrane 12 to move upwards while released. As a result, on the membrane side of this arrangement, a first finger of the first plurality of fixed fingers 14 attached to the membrane 12 may be deflected upwards in relation to a second finger of the second plurality of fixed fingers 20 attached to the counter electrode arrangement 18. In other words, in the rest position of the MEMS device 10, fingers 14 and 20 may be displaced in a position excluding maximum overlapping of surfaces of the fingers 14, 20. Therefore, capacitance of a unit cell formed by those fingers 14, 20 varies in a range having linear characteristics (refer to FIG. 7).

FIG. 10 shows a MEMS device 10 layout, for example a comb sensor microphone, in a plan view based on the arrangement schematically shown in FIGS. 9a and 9b. In this example, the membrane 12 may be attached to the support in a position comprising one of the length sides of the MEMS device 10 (in this example on the right side of the MEMS device 10). The interdigitated fingers may be arranged on the opposite length side (in this example on the left side of the MEMS device 10). The stress layer 22 may be arranged at the right side of the membrane 12 where the membrane 12 may be attached to the support.

FIGS. 11a and 11b show another example for manufacturing a MEMS device 10 in a schematic view. In this view, the membrane 12 may be supported by corner regions of the MEMS device 10 via resilient attachments 24_1, 24_2. The resilient attachments 24_1, 24_2 may have a corrugated shape. FIG. 11a shows the material of the membrane 12 deposited on the surface of the support 16 in-plane. Further, at both end sides of the membrane 12, stress layers 22_1, 22_2 may be bonded to the surface of the membrane 12, respectively. The arrangement of the stress layer 22_1, 22_2 may be regarded as an overlying stress layer relative to the membrane 12. As an alternative, an underlying stress layer may be also be possible. As a further alternative, both an overlying stress layer and an underlying stress layer may also be possible.

FIG. 11b shows the arrangement depicted in FIG. 11a having parts of the support removed, for example by sacrificial etching, excluding supports 16_1, 16_2 (corner regions of the MEMS device 10) used to support the membrane 12. Having parts of the support 16 removed, the membrane 12 may be released and thus able to move upwards. The bimorphic nature of the silicon nitride layer and the poly-silicon layer may cause the layers to contract from the poly-silicon layer towards the silicon nitride layer which contraction may result in bending moments on both end sides of the membrane 12. Due to the bending moments, forces F may be applied to the membrane 12 such that the membrane may move in an upward direction. This upward movement may be followed or accompanied by an expansion of the resilient attachments 24_1, 24_2 of the membrane 12, which expansion may be facilitated due to the corrugated shape of the resilient attachments 24_1, 24_2.

FIGS. 12a and 12b show a MEMS device 10 layout, for example a comb sensor microphone layout, manufactured using the configuration described above and shown in FIGS. 11a and 11b.

In this example, each of the length sides of the rectangular membrane 12 may comprise a portion of the first plurality of (fixed) fingers. Further, each of the length sides of the rectangular counter electrode arrangement may comprise a portion of the second plurality of (fixed) fingers, disposed in a spaced apart, interdigitated relationship with the first plurality of fingers attached to the membrane 12. In this example, the membrane 12 may be supported at each of the corners of the MEMS device 10.

FIG. 12b shows the vicinity of one of the corners of this layout in an enlarged view (refer to Block BL_B of FIG. 12a). As can be seen, the resilient attachment 24_2 may extend across a part of an arrangement shown schematically in FIGS. 11a and 11b. In contrast to the layout shown in FIG. 10, each of the four length sides of the MEMS device 10 may be equipped with respective fingers forming capacitor cells. Hence, compared to the exemplary layout shown in FIG. 10, the layout shown in FIGS. 12a and 12b may allow for higher capacity range. Maximum capacitance of the layout shown in FIG. 12a may be about four times the maximum capacitance of the layout shown in FIG. 10.

FIGS. 13a and 13b show an exemplary arrangement similar to the arrangement shown in FIGS. 11a and 11b. The arrangement shown in FIGS. 13a and 13b differs from the latter arrangement in that the resilient attachments 24_1, 24_2 may be oriented to form a rectangular angle to each other.

FIGS. 14a and 14b show a MEMS device 10 layout, for example a comb sensor microphone layout, manufactured using the configuration described above and shown in FIGS. 13a and 13b.

As can be seen best in FIG. 14b, a first extension A of resilient attachment 24_2 may be supported by a first region of a corner of the MEMS device 10, whereas a second extension B of resilient attachment 24_1 may be supported by a second region of this corner of the MEMS device 10, whereas both first and second region of this corner of the MEMS device 10 are positioned adjacent to each other. Further, both extensions A and B may be arranged in such a manner to each other to form a rectangular angle having the point of intersection positioned on the membrane 12. This arrangement may be different to the arrangement shown in FIGS. 12a and 12b, in which arrangement the resilient attachments may be disposed diametrically opposed.

Figure 15A:
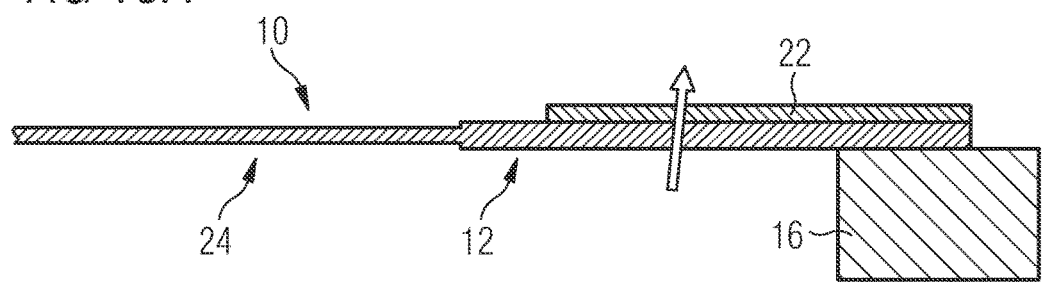
FIG. 15a schematically shows a part of the comb sensor microphone including the membrane in a cross-sectional view used to exemplify deposition of a stress layer.
Figure 15B:
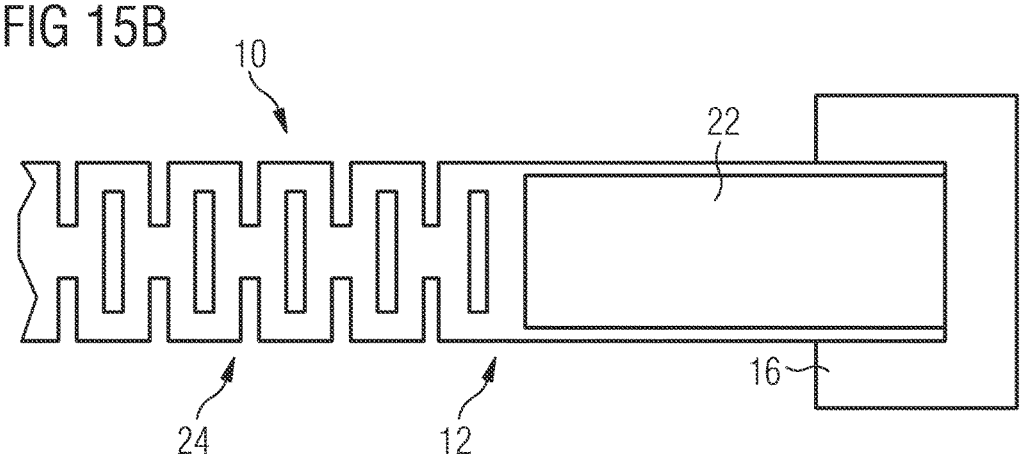
FIG. 15b shows the part depicted in FIG. 15a in a plan view, wherein the membrane comprises a meander like element.

FIGS. 15a and 15b show in a partial view an example of the MEMS device 10 both in a cross-sectional view and a plan view. In this example, the stress layer 22 may be bonded on the surface of the membrane 12 in a region overlapping at least a portion of the support 16. Further, in this example, the resilient attachment 24 of the membrane 12 may comprise a portion having a meander configuration. This meander configuration may provide improved resilient characteristics.

Figure 16A:
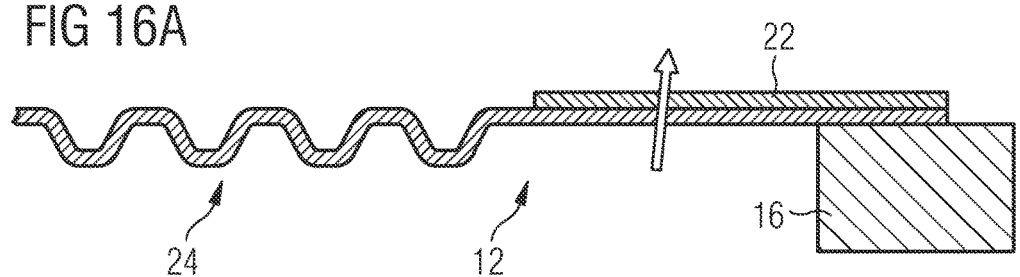
FIGS. 16a-16d schematically show a part of the comb sensor microphone including the membrane in a cross-sectional view used to exemplify different depositions of a stress layer, respectively.
Figure 16B:
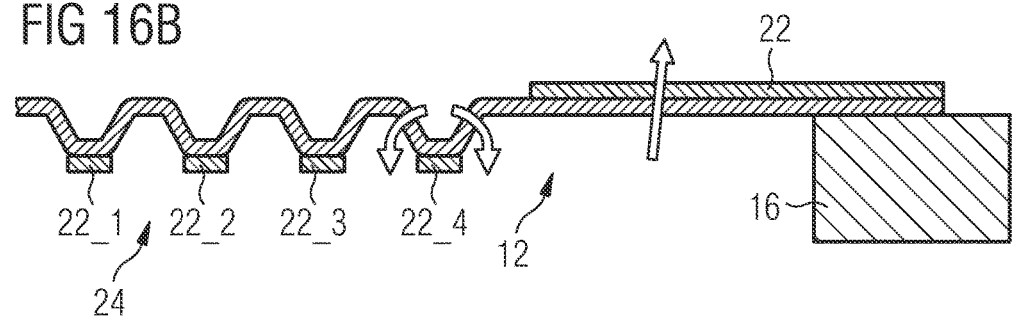
Figure 16C:
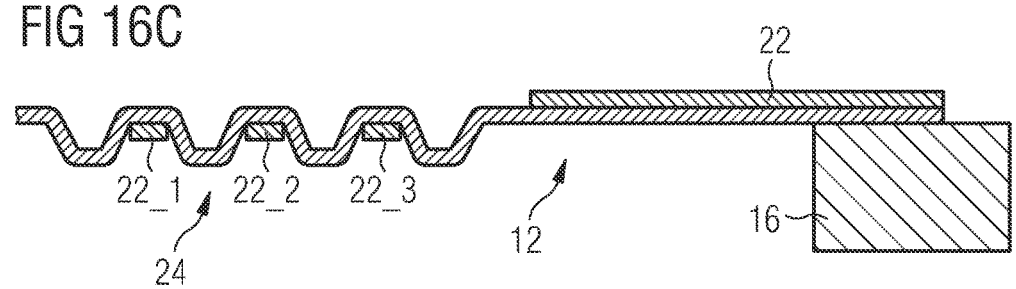
Figure 16D:
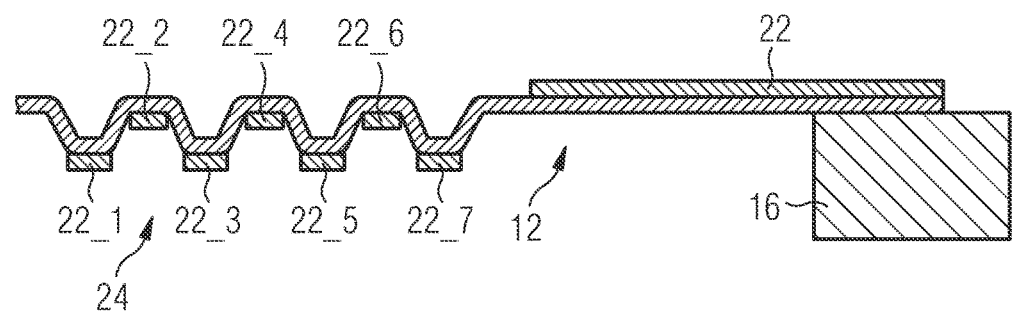

FIGS. 16a to 16d show alternative anchor situations with bimorph character in a cross-sectional view, respectively. In these figures, the stress layer 22 may be bonded to the surface of the membrane 12 in a position overlapping at least a portion of the support 16. In FIG. 16a, bonding a stress layer to further portions of the membrane 12 is omitted.

Based on the arrangement mentioned above and as shown in FIG. 16b, lower portions of the corrugated form of the resilient attachment 24 are provided with stress layers 22_1 to 22_4. Based on the arrangement mentioned above and as shown in FIG. 16c, upper portions of the corrugated form of the resilient attachment 24 are provided with stress layers 22_1 to 22_3. Based on the arrangement mentioned above and as shown in FIG. 16d, both upper and lower portions of the corrugated form of the resilient attachment 24 are provided with stress layers 22_1 to 22_7.

Figure 17A:
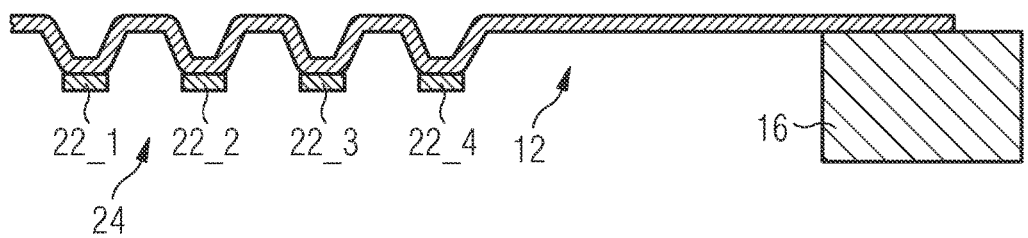
FIGS. 17a-17c schematically show a part of the comb sensor microphone including the membrane in a cross-sectional view used to exemplify different depositions of a stress layer, respectively.
Figure 17B:
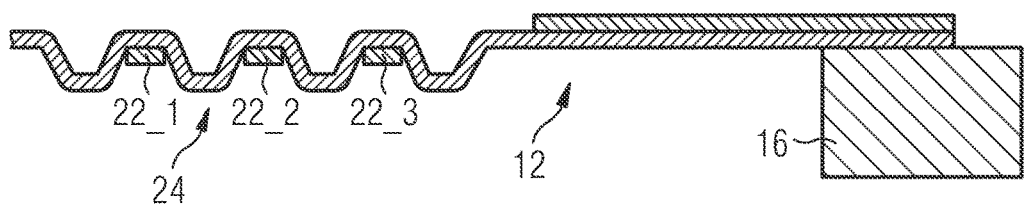
Figure 17C:
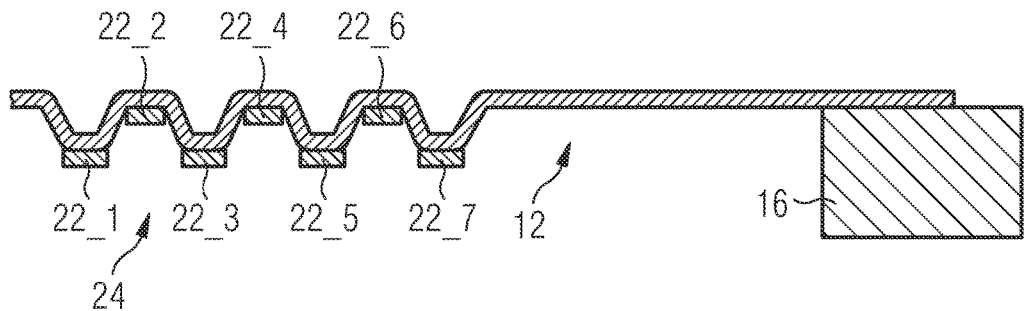

FIGS. 17a to 17c show arrangements which differ from the arrangements shown in FIGS. 16a to 16d in that bonding the stress layer on the surface of the membrane 12 such to overlap at least a portion of the support 16 may be omitted. Based on this arrangement and as shown in FIG. 17a, lower portions of the corrugated form of the resilient attachment 24 may be provided with stress layers 22_1 to 22_4.

Based on the arrangement mentioned above and as shown in FIG. 17b, upper portions of the corrugated form of the resilient attachment 24 may be provided with stress layers 22_1 to 22_3. FIG. 17c shows an arrangement combining the arrangements shown in FIGS. 17a and 17b. In other words, both lower and upper portions of the corrugated form of the resilient attachment 24 may be provided with stress layers 22_1 to 22_7.

The different arrangements shown in FIGS. 16a to 17c can be used to cope with different requirements of the MEMS device 10.

Although some aspects have been described in the context of a device, it is clear that these aspects also represent a description of the corresponding method, where a block or device corresponds to a method step or a feature of a method step. Analogously, aspects described in the context of a method step also represent a description of a corresponding block or item or feature of a corresponding device.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A MEMS device comprising:
    a membrane comprising a released portion having a first plurality of fingers;
    a counter electrode arrangement comprising a second plurality of fingers disposed in an interdigitated relationship with the first plurality of fingers, wherein the second plurality of fingers are moveable in relation to the released portion having the first plurality of fingers;
    a support, wherein the membrane is attached to the support resiliently by a resilient attachment, so that the released portion of the membrane is movable with respect to the support; and
    a deflector directly or indirectly affixed to the membrane and configured to deflect the membrane such that the first and second plurality of fingers are displaced in a rest position excluding maximum overlapping of surfaces of the fingers,
    wherein the deflector comprises a stress layer bonded to a surface of the membrane, and wherein the dielectric material of the stress layer and the material of the membrane are selected such that the different intrinsic stress of the dielectric material of the stress layer compared to the material of the membrane causes the resilient attachment to bend and the membrane to deflect.

2. The MEMS device according to claim 1, wherein the stress layer and the membrane are selected from materials, respectively, creating, when bonded to each other, a force in relation to each other resulting in a contraction or expansion of the stress layer.

3. The MEMS device according to claim 2, wherein the materials of the stress layer and the membrane, respectively, are selected such that the contraction or expansion of the stress layer results in a deflection of the membrane.

4. The MEMS device according to claim 1, wherein the material of the membrane comprises poly-silicon, aluminum or copper, and wherein the dielectric material of the stress layer comprises oxide, SiN, Si3N4, SixNyO or a polyimide.

5. The MEMS device according to claim 1, wherein, in a plane parallel to the surface of the membrane, the deflector is configured to offset planes of the first and second plurality of fingers, respectively.

6. The MEMS device according to claim 1, wherein the deflector is configured to offset the overlapping area of opposite surfaces of the first and second plurality of fingers in the rest position within a range of 40% to 60%.

7. The MEMS device according to claim 1,
wherein the support supports the counter electrode arrangement, so that the second plurality of fingers is fixed with respect to the support.

8. The MEMS device according to claim 7, wherein the deflector is arranged in a position overlapping at least a portion of the support.

9. The MEMS device according to claim 7, wherein the resilient attachment comprises a portion of the membrane having a meander configuration.

10. The MEMS device according to claim 7, wherein the resilient attachment comprises a portion of the membrane having a corrugated configuration.

11. The MEMS device according to claim 10, wherein the deflector comprises a stress layer bonded to a surface of the membrane and the stress layer is composed of a material exhibiting different intrinsic stress compared to the material of the membrane, wherein the stress layer is bonded to portions of the corrugated membrane being in-plane to the plane of the membrane.

12. The MEMS device according to claim 7, wherein the membrane is configured in a substantially rectangular form.

13. The MEMS device according to claim 12, wherein the membrane is resiliently attached to the support in an attachment position comprising at least one lengthside of the membrane.

14. The MEMS device according to claim 13, wherein the first plurality of fingers is attached to a perimeter of the membrane opposing the attachment position.

15. The MEMS device according to claim 12, wherein the membrane is resiliently attached to the support in a position comprising portions of each lengthside of the membrane.

16. The MEMS device according to claim 15, wherein the first plurality of fingers is attached to a perimeter of the membrane comprising portions of each of the lengthsides of the membrane.

17. The MEMS device according to claim 12, wherein the membrane is resiliently attached to the support at positions comprising corners of the membrane.

18. The MEMS device according to claim 17, wherein the resilient attachment comprises a portion of the membrane having a corrugated configuration extending at least partially in a direction linking opposing corners.

19. The MEMS device according to claim 18, wherein the first plurality of fingers is attached to a perimeter of the membrane comprising each lengthside of the membrane.

20. The MEMS device according to claim 1, wherein the MEMS device is configured to produce an output signal responsive to the relative movement of the membrane and the counter electrode arrangement.

21. An electrostatic transducer comprising:
a membrane comprising a released portion having a first plurality of fingers;
a counter electrode arrangement having a second plurality of fingers disposed in an interdigitated relationship with the first plurality of fingers, wherein the second plurality of fingers are moveable in relation to the released portion having the first plurality of fingers;
a support, wherein the membrane is attached to the support resiliently by a resilient attachment, so that the released portion of the membrane is movable with respect to the support; and
a deflector directly or indirectly affixed to the membrane and configured to deflect the membrane such that the first and second plurality of fingers are displaced in a rest position excluding maximum overlapping of surfaces of the fingers,
wherein the deflector comprises a stress layer bonded to a surface of the membrane, and wherein the dielectric material of the stress layer and the material of the membrane are selected such that the different intrinsic stress of the dielectric material of the stress layer compared to the material of the membrane causes the resilient attachment to bend and the membrane to deflect.

22. A method for manufacturing a MEMS device comprising a membrane and a counter electrode arrangement, the method comprising:
depositing a membrane layer on a surface, wherein the membrane is attached to a support resiliently by a resilient attachment;
structuring the membrane layer to form an interdigitated comb drive comprising a first and second plurality of interdigitated fingers attached to a released portion of the membrane and the counter electrode arrangement, respectively, wherein the second plurality of fingers are moveable in relation to the released portion having the first plurality of fingers;
providing a deflector affixed to a portion of the membrane layer, wherein the deflector comprises a stress layer, the stress layer comprising a dielectric material exhibiting different intrinsic stress compared to a material of the membrane; and
performing a release etch that causes the released portion of the membrane to be movable with respect to the support and causes the deflector to deflect the membrane and to displace the first and second plurality of interdigitated fingers in a rest position excluding maximum overlapping of surfaces of the fingers, wherein the dielectric material of the stress layer and the material of the membrane are selected such that the different intrinsic stress of the dielectric material of the stress layer compared to the material of the membrane causes the resilient attachment to bend and the membrane to deflect.

23. The MEMS device according to claim 1, wherein in the rest position, a displacement of the first and second plurality of fingers is achieved by a biomorphic layer stress of the stress layer and the membrane.

24. The MEMS device according to claim 1, wherein the deflector is configured to deflect the membrane in the rest position during a not-operated condition of the MEMS device.

25. The MEMS device according to claim 1, wherein the membrane, the counter electrode arrangement, and the deflector are part of the MEMS device.

26. The MEMS device according to claim 1, wherein the released portion of the membrane overlies a cavity in a substrate.

27. The MEMS device according to claim 1, wherein a displacement of the first and second plurality of fingers in the rest position form an operating point of the MEMS device, which is positioned in an operating range showing a substantially linear characteristic.

28. The MEMS device according to claim 27, wherein the operating range is within one of substantially linear sections of a capacity-over-displacement characteristic.

29. The MEMS device according to claim 27, wherein the operating point is substantially centered with respect to a dynamic range of a substantially linear operation.

\* \* \* \* \*